(12) United States Patent
Khaja

(10) Patent No.: US 10,811,325 B2
(45) Date of Patent: Oct. 20, 2020

(54) SELF-HEALING SEMICONDUCTOR WAFER PROCESSING

(71) Applicant: Applied Materials, Inc., Santa Clara, CA (US)

(72) Inventor: Abdul Aziz Khaja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 37 days.

(21) Appl. No.: 15/687,343

(22) Filed: Aug. 25, 2017

(65) Prior Publication Data
US 2018/0061721 A1    Mar. 1, 2018

Related U.S. Application Data

(60) Provisional application No. 62/380,254, filed on Aug. 26, 2016.

(51) Int. Cl.
*H01L 21/66*    (2006.01)

(52) U.S. Cl.
CPC .............. *H01L 22/26* (2013.01); *H01L 22/12* (2013.01); *H01L 22/20* (2013.01)

(58) Field of Classification Search
CPC .......... H01L 22/26; H01L 22/12; H01L 22/20
See application file for complete search history.

(56) References Cited

U.S. PATENT DOCUMENTS

| | | | | |
|---|---|---|---|---|
| 6,148,246 | A * | 11/2000 | Kawazome | G05B 19/418 700/106 |
| 7,759,136 | B2 * | 7/2010 | Hung | H01L 22/26 257/E21.521 |
| 7,966,142 | B2 * | 6/2011 | Zhou | G01B 21/045 702/85 |
| 9,275,918 | B2 * | 3/2016 | Lu | H01L 22/26 |
| 9,875,946 | B2 * | 1/2018 | Shchegrov | H01L 22/12 |
| 10,203,200 | B2 * | 2/2019 | Marciano | H01L 22/12 |
| 10,242,290 | B2 * | 3/2019 | Tarshish-Shapir | G06T 7/0004 |

(Continued)

OTHER PUBLICATIONS

Wan et. al., "On Regression Methods for Virtual Metrology in Semiconductor Manufacturing," ISSC 2014 / CIICT 2014, Limerick, Jun. 26-27.*

(Continued)

*Primary Examiner* — Allen L Parker
*Assistant Examiner* — Charles N Ausar-El
(74) *Attorney, Agent, or Firm* — Patterson + Sheridan LLP

(57) ABSTRACT

Implementations of the present disclosure generally relate to methods for processing substrates, and more particularly, to methods for predicting, quantifying and correcting process drift. In one implementation, the method includes performing a design of experiments (DOE) in a process chamber to obtain sensor readings and film properties at multiple locations on a substrate for every adjustable process control change associated with the process chamber, building a regression model for each location on the substrate using the sensor readings and film properties obtained from the DOE, tracking changes in sensor readings during production, identifying drifting in sensor readings that can lead to a change in film properties using the regression model, and adjusting one or more process controls to correct the drifting in sensor readings to minimize the change in film properties.

11 Claims, 1 Drawing Sheet

(56) References Cited

U.S. PATENT DOCUMENTS

| | | | |
|---|---|---|---|
| 2003/0045960 A1* | 3/2003 | Yamamoto | H01L 21/67253 700/121 |
| 2006/0047356 A1* | 3/2006 | Funk | G05B 19/41865 700/121 |
| 2006/0055928 A1* | 3/2006 | Chang | G01B 21/042 356/400 |
| 2007/0095799 A1 | 5/2007 | Matsuzawa et al. | |
| 2008/0208385 A1 | 8/2008 | Sakamoto et al. | |
| 2009/0307163 A1 | 12/2009 | Jang et al. | |
| 2010/0312374 A1* | 12/2010 | Tsai | G01R 31/2894 700/110 |
| 2013/0305206 A1* | 11/2013 | Pandev | G06F 17/5081 716/136 |
| 2014/0118751 A1* | 5/2014 | Rajagopalan | H01L 21/00 356/630 |
| 2014/0141542 A1* | 5/2014 | Kang | C23C 16/345 438/14 |
| 2014/0316730 A1* | 10/2014 | Shchegrov | H01L 22/12 702/81 |
| 2015/0008132 A1 | 1/2015 | Stahl et al. | |
| 2015/0262894 A1* | 9/2015 | Lu | H01L 22/26 438/5 |
| 2016/0155676 A1 | 6/2016 | Kang et al. | |
| 2016/0371073 A1* | 12/2016 | Walle | G06F 8/61 |
| 2017/0358506 A1* | 12/2017 | Ohashi | H01L 21/32136 |
| 2017/0365531 A1* | 12/2017 | Tedeschi | H01L 22/26 |
| 2018/0220518 A1* | 8/2018 | Polyakov | H05G 2/00 |

OTHER PUBLICATIONS

Besnard et. al., "Virtual Metrology Modeling for CVD Film Thickness", International Journal of Control Science and Engineering 2012, 2(3): 26-33. (Year: 2012).*

Choo et. al., "Simulation-Based Design and Experimental Evaluation of a Spatially Controllable CVD Reactor", AIChE Journal 51: 572-584, 2005 (Year: 2005).*

Hu, Gangshi, "Stochastic Modeling and Control of Film Porosity, Surface Roughness and Thickness in Thin Film Growth, A dissertation submitted in partial satisfaction of the requirements for the degree Doctor of Philosophy in Chemical Engineering", University of California, Los Angeles, 2010. (Year: 2010).*

International Search Report and Written Opinion dated Nov. 15, 2017 for Application No. PCT/US2017/045348.

* cited by examiner

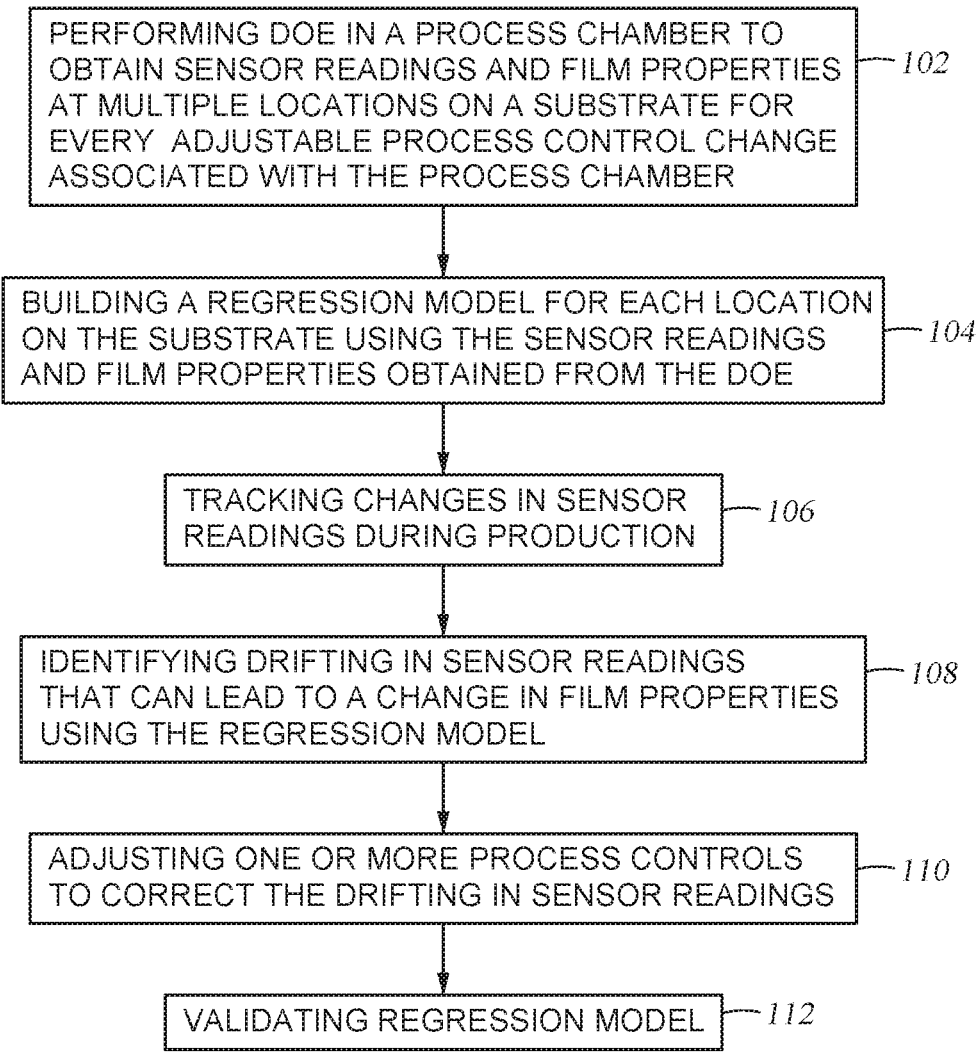

SELF-HEALING SEMICONDUCTOR WAFER PROCESSING

CROSS-REFERENCE TO RELATED APPLICATIONS

This application claims priority to U.S. Provisional Patent Application Ser. No. 62/380,254, filed on Aug. 26, 2016, which herein is incorporated by reference.

BACKGROUND

Field

Implementations of the present disclosure generally relate to methods for processing substrates, and more particularly, to methods for predicting, quantifying, and correcting process drift.

Description of the Related Art

Many industries employ sophisticated manufacturing equipment that includes multiple sensors and controls, each of which may be monitored during processing to ensure product quality. However, methods such as univariate models, trend charts, or statistics process monitoring, for the multiple sensors and controls are not sufficient in identifying process drifts. For example, when a process is drifting in the process chamber, changing an incorrect tuning variable or a single variable to dial-in the process that is drifting is often incorrect. This also leads to increased time in chamber recovery and decreased mean wafer between clean (MWBC).

Therefore, there is a need for an improved method for predicting, quantifying and correcting process drift.

SUMMARY

Implementations of the present disclosure generally relate to methods for processing substrates, and more particularly, to methods for predicting, quantifying and correcting process drift.

In one implementation, a method includes performing a design of experiments in a process chamber to obtain sensor readings and film properties at multiple locations on a test substrate for every adjustable process control associated with the process chamber, building a regression model for each location on the test substrate using the sensor readings and the film properties obtained from the design of experiments, tracking changes in sensor readings during production in the process chamber, identifying drifting in sensor readings that can lead to a change in film properties of a film formed on a production substrate using the regression model, and adjusting one or more process controls to correct the drifting identified in sensor readings.

In one implementation, a method includes performing a design of experiments in a process chamber to obtain sensor readings and film properties at multiple locations on a test substrate for every adjustable process control associated with the process chamber, building a regression model for each location on the test substrate using the sensor readings and the film properties obtained from the design of experiments, tracking changes in sensor readings during production in the process chamber, identifying drifting in sensor readings that can lead to a change in film properties of a film formed on a production substrate using the regression model, and stopping the production.

In one implementation, a method includes predicting film properties during a film forming process in a process chamber, wherein predicting film properties includes tracking sensor readings in the process chamber, and identifying a drift in the sensor readings that can lead to a change in the film properties of the film formed on a production substrate using a regression model.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

FIG. 1 illustrates operations of a method according to one implementation disclosed herein.

DETAILED DESCRIPTION

Implementations of the present disclosure generally relate to methods for processing substrates, and more particularly, to methods for predicting, quantifying and correcting process drift. In one implementation, the method includes performing a design of experiments (DOE) in a process chamber to obtain sensor readings and film properties at multiple locations on a substrate for every adjustable process control change associated with the process chamber, building a regression model for each location on the substrate using the sensor readings and film properties obtained from the DOE, tracking changes in sensor readings during production, identifying drifting in sensor readings that can lead to a change in film properties using the regression model, and adjusting one or more process controls to correct the drifting in sensor readings to minimize the change in film properties. The method not only predicts and quantifies the process drift or mismatch in process conditions (i.e., sensor readings), but also corrects sensor reading drifting to keep the process chamber performance stable.

FIG. 1 illustrates operations of a method 100 according to one implementation disclosed herein. The method 100 starts at block 102, which is performing a DOE in a process chamber to obtain sensor readings and film properties at multiple locations on a substrate for every adjustable process control change associated with the process chamber. The process chamber may be any suitable process chamber, such as a chemical vapor deposition (CVD) chamber, plasma enhanced chemical vapor deposition (PECVD) chamber, or physical vapor deposition (PVD) chamber. The DOE may be performed by placing a substrate into the process chamber and perform a process on the substrate. The process may be a deposition process, an etch process, a nitridation process, an implant process, a planarization process, a clean process, an oxidation process, or any suitable process. Sensor readings and film properties are recorded for every change in an adjustable process control. Multiple changes to each adjustable process controls associated with the process chamber and the process are made for the process performed on the substrate, and the resulting sensor readings from all the sensors during the process and the effects of the changes on film properties are recorded. The film properties are measured at multiple locations on the substrate. The number of locations on the substrate ranges from 10 to 700, such as from 49 to 625.

For example, an adjustable process control, such as a valve controlling the flow rate of a precursor gas flowing into the process chamber, is adjusted, and the sensor readings (process conditions), such as flow rate of the precursor, temperature of the substrate, pressure inside of the process chamber, and other suitable sensor readings, are recorded. In addition, metrology is performed on the substrate to measure film properties, such as deposition or etch rate, thickness uniformity, film stress, and other suitable film properties. Thus, for a single change to a process control, the effect of the change on sensor readings from all sensors in the process chamber and on film properties at multiple locations on the substrate is recorded. More than one change may be made to the process control, and the effect of each change on sensor readings from all sensors in the process chamber and on film properties at multiple locations on the substrate is recorded. The DOE can be used to fingerprint changes in each sensor used during the process and to fingerprint changes in each film property at each location on the substrate. The DOE provides a spatial signature, in terms of film properties, of the substrate based on the sensor readings and process control changes. When performing the DOE in different process chambers, chamber to chamber, relative change in sensor readings and film properties should be the same.

Next, at block 104, a regression model is built for each location on the substrate using the sensor readings and film properties obtained from the DOE at block 102. The regression model may include multiple sensor readings that can affect the film properties. In one implementation, the regression model is a linear regression model. For example, a linear regression model may be f{film properties}=x{sensor reading}*$\beta$, where $\beta$ is a constant calculated based on the film properties and sensor readings obtained from the DOE. At each location on the substrate, a regression model may include multiple sensor readings that are related to a specific film property. For example, at a location on the substrate, a film property, for example the film thickness, is a related to multiple sensor readings, and the relationship can be expressed by formula $y=\beta_0+\beta_1*x_1+\beta_2*x_2+\beta_3*x_3\ldots$, where y is the film property, $\beta_0$ is a constant, $x_1$, $x_2$, $x_3$ are sensor readings from multiple sensors, and $\beta_3$, $\beta_2$, $\beta_3$ are constants corresponding to $x_1$, $x_2$, $x_3$, respectively. Since y, $x_1$, $x_2$, and $x_3$ are known based on the data collected from the DOE, $\beta_0$, $\beta_1$, $\beta_2$, and $\beta_3$ can be calculated. In other words, changes in sensor behavior (expressed as sensor readings) with respect to changes in film properties at each location on the substrate are tracked. In some implementations, instead of each individual location on the substrate, an average value over a zone, such as a radial zone, may be utilized so a regression model is generated for each zone on the substrate. The substrate may be divided into different zones, such as radial, planar or residual.

Next, at block 106, changes in sensor readings during production (i.e., processing a substrate, for example forming a film on the substrate) are tracked. The production may be processing a substrate that is similar to the substrate used for the DOE at block 102, and the process performed on the substrate may be similar to the process performed on the substrate for the DOE at block 102. The production may be performed in the processing chamber in which the DOE was performed.

Any sensor readings that are drifting from set points and can lead to a change in film properties using the regression model are identified, as shown at block 108. The drifting in sensor readings can be identified as drifting away from set points by a predetermined amount that may range from about 0.5% to 3.0%. Any drifting in sensor readings less than about 0.5% may be noise and not affect any film properties. Any drifting in sensor readings greater than 3.0% indicates an issue that may require stopping the process. If a sensor reading has drifted from set points by about 0.5% to about 3.0%, and the regression model indicates that such drift would lead to a change to one or more film properties, one or more process controls are adjusted to correct the drifting in the sensor reading, as shown at block 110.

The data obtained from the DOE can be used to identify which one or more process controls to adjust in order to correct the drifting of the sensor reading. The tracking operation of block 106, the identifying operation of block 108, and the adjusting operation of block 110 may be performed by computer software. In other words, the operations of blocks 106, 108 and 110 may be automatic.

The operations shown at blocks 106, 108 and 110 may be referred to as advanced virtual metrology. The advanced virtual metrology can predict the film properties without performing a metrology test during production. Film properties can be predicted by tracking the sensor readings and identifying the drifting in sensor readings that can lead to a change in film properties. The data collected from the DOE at block 102 is used to build a regression model at block 104. The regression model is then used in actual production to help identify drifting in sensor readings that can lead to a change in film properties. The regression model may be validated, as shown at block 112. In order to validate the regression model, metrology is performed on the substrate, and film properties obtained from metrology tests are compared to the predicted film properties based on the regression model. The frequency of validating the regression model may be based on the process performed.

The operations at blocks 102, 104, 106, 108, 110 and 112 can be used to improve layer to layer uniformity, substrate to substrate uniformity, and chamber to chamber uniformity, such as film thickness uniformity. In addition, the operations can be used to minimize in plane displacement (IPD) value and to improve critical dimension (CD) consistency. Because the effect of each sensor reading change on film properties are obtained by the DOE, the film properties can be precisely controlled.

In some implementations, a process recipe is calculated based on the desired film properties using the regression model. For example, entering film properties will determine the process recipe with matched sensor readings.

The method, such as the method 100, not only predicts and quantifies the process drift or mismatch in process conditions (i.e., sensor readings), but also corrects sensor reading drifting to keep the process chamber performance stable.

While the foregoing is directed to implementations of the present disclosure, other and further implementations of the disclosure may be devised without departing from the basic scope thereof, and the scope thereof is determined by the claims that follow.

The invention claimed is:
1. A method, comprising:
   performing a design of experiments in a process chamber, the design of experiments comprising:
   positioning a test substrate into the process chamber;
   performing a process on the test substrate, wherein the process is controlled by a plurality of process controls;

adjusting a first of the plurality of process controls during the process performed on the test substrate;

recording a first set of process chamber sensor readings following the adjusting of the first of the plurality of process controls;

adjusting a second of the plurality of process controls during the process performed on the test substrate; and recording the first set of process chamber sensor readings following the adjusting of the second of the plurality of process controls;

building a regression model for each location on the test substrate using the first set of sensor readings obtained from the design of experiments;

positioning a production substrate in the process chamber; and depositing a film on the production substrate, wherein the depositing is controlled by the plurality of process controls, the depositing comprising:

tracking changes of a second set of process chamber sensor readings during the depositing of the film on the production substrate in the process chamber;

identifying drifting in the second set of process chamber sensor readings that drift, using the regression model, during the depositing of the film on the production substrate from a plurality of set points by 0.5 percent to 3.0 percent;

adjusting one or more of the plurality of process controls during the depositing of the film on the production substrate to correct the identified drift in the second set of process chamber sensor readings; and continuing the depositing of the film on the production substrate after the adjusting of the one or more of the plurality of process controls.

2. The method of claim 1, wherein the regression model includes multiple sensor readings relating to one of the film properties.

3. The method of claim 2, wherein the one of the film properties is a thickness of the film.

4. The method of claim 1, wherein the one or more process controls are identified from the design of experiments.

5. The method of claim 1, further comprising validating the regression model.

6. The method of claim 5, wherein the validating the regression model comprises:

performing metrology on the production substrate to obtain film properties of the film; and comparing the film properties obtained from the metrology to predicted film properties based on the regression model.

7. A method, comprising:

performing a design of experiments in a process chamber, the design of experiments comprising:

positioning a test substrate into the process chamber;

performing a process on the test substrate, wherein the process is controlled by a plurality of process controls;

adjusting a first of the plurality of process controls during the process performed on the test substrate;

recording a first set of process chamber sensor readings following the adjusting of the first of the plurality of process controls;

adjusting a second of the plurality of process controls during the process performed on the test substrate; and recording the first set of process chamber sensor readings following the adjusting of the second of the plurality of process controls;

building a regression model for each radial zone on the test substrate using the first set of sensor readings from the design of experiments;

positioning a production substrate in the process chamber; and depositing a film on the production substrate, wherein the depositing is controlled by the plurality of process controls, the depositing comprising:

tracking changes of a second set of process chamber sensor readings during the depositing of the film on the production substrate in the process chamber; and identifying drifting in the second set of process chamber sensor readings that drift, using the regression model, during the deposition of the film on the production substrate; wherein if the drifting in the second set of process chamber sensor readings is less than 0.5 percent, then continuing the depositing of the film on the production substrate without adjusting a process control of the plurality of process controls associated with the drifting;

if the drifting in the second set of process chamber sensor readings is within a range of 0.5 percent to 3.0 percent, then adjusting one or more process controls of the plurality of process controls during the depositing of the film on the production substrate, and then continuing the depositing of the film on the production substrate after the adjusting; and if the drifting in the second set of process chamber sensor readings is greater than 3.0 percent, then stopping the depositing of the film on the production substrate.

8. The method of claim 7, wherein the regression model includes multiple sensor readings relating to one of the film properties.

9. The method of claim 8, wherein the one of the film properties is a thickness of the film.

10. The method of claim 7, further comprising validating the regression model.

11. The method of claim 10, wherein the validating the regression model comprises:

performing metrology on the production substrate to obtain film properties; and comparing the film properties obtained from the metrology to predicted film properties based on the regression model.

\* \* \* \* \*